United States Patent [19]

McKenna et al.

[11] Patent Number: 4,810,931
[45] Date of Patent: Mar. 7, 1989

[54] FILL FLUID FOR TFEL DISPLAY PANELS AND METHOD OF FILLING

[75] Inventors: John F. McKenna, Newburyport, Mass.; Jeff Witzel, Bedford, N.H.

[73] Assignee: GTE Products Corporation, Danvers, Mass.

[21] Appl. No.: 136,221

[22] Filed: Dec. 21, 1987

[51] Int. Cl.$^4$ .................. H05B 33/04; H01J 9/395
[52] U.S. Cl. .................. 313/509; 313/512; 445/43; 445/53
[58] Field of Search .............. 313/512, 509; 445/25, 445/38, 43, 44, 53

[56] References Cited

U.S. PATENT DOCUMENTS

| | | | |
|---|---|---|---|
| 3,320,459 | 5/1967 | Stone | 313/512 |
| 3,330,982 | 7/1967 | Dickson, Jr. | 313/512 X |
| 4,213,074 | 7/1980 | Kawaguchi et al. | 313/512 X |
| 4,287,449 | 9/1981 | Takeda et al. | 313/509 |
| 4,357,557 | 11/1982 | Inohara et al. | 313/512 X |
| 4,446,399 | 5/1984 | Endo et al. | 313/512 X |
| 4,447,757 | 5/1984 | Kawaguchi et al. | 313/512 X |
| 4,618,802 | 10/1986 | Schrank | 445/25 X |

Primary Examiner—Palmer C. DeMeo
Attorney, Agent, or Firm—Martha Ann Finnegan

[57] ABSTRACT

Perfluorinated inert liquids are used as the protective fill fluid in thin film electroluminescent (TFEL) flat panel displays according to the present invention. These fluids enhance panel aging and life test characteristics. Novel filling methods are also described.

12 Claims, 1 Drawing Sheet

FILL FLUID FOR TFEL DISPLAY PANELS AND METHOD OF FILLING

BACKGROUND OF THE INVENTION

The present invention relates to a thin film electroluminescent (TFEL) display panel and more particularly, to a novel protective fill fluid for a thin-film electroluminescent display panel shielded by a pair of glass substrates with a protective material disposed therebetween.

For general background information on TFEL panels, see the "EL Glass Catalog and Design Handbook," Planar Systems, Inc Beaverton, Oreg. 97006, the contents of which, to the extent necessary, are hereby incorporated herein by reference.

A conventional TFEL display panel is illustrated in FIG. 1, wherein the panel comprises a first transparent glass substrate a plurality of transparent electrodes 2 made of $In_2O_3$ or $SnO_2$, and the like, a first dielectric layer 3, an electroluminescent (EL) thin film 4, a second dielectric layer 5, a plurality of counter-electrodes 6 made of for example Al, spacers 10, and a counter-substrate or cover plate 11, which may be made of glass. See, for example, U.S. Pat. No. 4,213,074 to Kawaguchi et al.

As illustrated, the transparent electrodes 2 are arranged on the glass substrate 1 in parallel with each other. The counter-electrodes 6 are arranged so that they cross at a right angle relative to the transparent electrode 2 in a plane view. The cross points between each of the transparent electrodes 2 and the counter-electrodes 6 create a picture element (pixels) i.e. the image forming portion of the TFEL panel. A power source (not shown) is applied to the transparent electrode 2 and the counter-electrode 6.

The first dielectric layer 3 may comprise $Y_2O_3$, $TiO_2$, $Al_2O_3$, $Si_3N_4$, $SiO_2$, and the like, which may be deposited for example by a sputtering technique or by electron beam evaporation. The EL thin film 4 may be made for example, from a ZnS thin film doped with an impurity, for example manganese. The second dielectric layer 5 generally comprises a material similar to that of the first dielectric layer 3.

The TFEL panel is generally provided with a sealing structure for the EL composite member which comprises the first and second dielectric layers 3, 5 and the thin EL film 4. The cover plate 11, together with the transparent glass substrate 1, provide the basic structure for sealing the EL unit. The cover plate 11 need not be transparent because viewing may be conducted through the transparent glass substrate 1. One or more spacers 10 may be employed for positioning the cover plate 11. An adhesive 12 is coated for bonding the transparent glass substrate 1, the spacer 10, and the cover plate 11.

An adhesive 12 is generally employed, which may be an epoxy resin or the like. Lead terminals 15 of the transparent electrodes 2 and the counter-electrodes 6 may be formed on the transparent glass substrate 1 and extended toward the cavity. A control circuit (not shown) is coupled to the lead terminals 15 to apply the power to the EL unit.

A protective substance 13 may be added to the cavity defined by the two plates 1 and 11. A protective substance 13 functions to preserve the TFEL panel, especially the EL unit. The protective substance may be a gas or a liquid, but liquids are preferred. See, for example, U.S. Pat. No. 3,330,982 to Dickson, and U.S. Pat. No. 4,447,757 to Kawaguchi et al. Typical protective gases include inert gases such as nitrogen, argon, and the like. Typical protective liquids include silicon oils or greases.

A spacer 10 may be employed, and it may be formed from an insulating plastic sheet made of for example, a polyacetal resin or a polyimide resin, or a silicon rubber, or a glass plate. Finally, at least one fill hole 14 is generally provided, for the introduction of the protective substance 13.

If desired, a dye material or other color agent may be added to the protective substance in the TFEL panel to provide a background which can aid in the display characteristics of the panel.

TFEL panels of the type illustrated in FIG. 1 are very susceptible to moisture and therefore must be properly protected.

Prior to the present invention, silicone oils or grease were typically employed as the protective fill fluid for TFEL panels. Typically the method employed for filling TFEL panels with these substances involved the use of a cover plate having at least one hole. The cavity of the TFEL panel was filled by pumping out the air or gas in the panel and then allowing gravity and atmospheric pressure to move the protective liquid, e.g., silicone oil, into the panel. The hole was then sealed off using a glass disc adhesively bonded over the fill hole.

This method has several disadvantages; (1) the method is time consuming and bubbles are occasionally left in the oil which demands an additional pump-out step; (2) silicone oil (and grease) is extremely difficult to clean off the glass surface making it very difficult to bond to the glass reliably for hole closing; (3) silicone oils (and greases) absorb up to approximately 0.1% or 1000 ppm water from the atmosphere. This water must be baked out and vacuum pumped out of the oil prior to filling the panel. Water is extremely degrading to TFEL panel performance and, therefore, must be kept at very, very low levels.

SUMMARY OF THE INVENTION

The fill fluid of the present invention overcomes the aforementioned problems encountered in prior art and affords the opportunity of utilizing alternate filling procedures.

The unique fill fluids of the present invention are generically represented by the term "perfluorinated inert fluids." These compounds include perfluoroalkanes, perfluoroaliphatic ethers and perfluoroalkyl tertiary amines, having boiling points equal to or above the operating temperature of the TFEL panel in which the compound is employed as a protective fluid.

These compounds are colorless, odorless, dense, virtually non-toxic, and non-flammable compounds with an extremely non-polar character Such compounds have previously found use as dielectric heat transfer and test bath fluids in the electronics industry and as hydraulic fluids and lubricants in specialty applications. See, Fluorine Compounds, Organic, in the *Kirk-Othmer Encyclopedia of Chemical Technoloy*, Vol. 10, pages 829–839; 856–870; and 874–881 (John Wiley & Sons, New York 1980), the disclosure of which, to the extent necessary, is hereby incorporated herein by reference.

Other advantages of the use of perfluorinated inert liquids over silicone oils or greases include their low viscosity, which permits rapid filling of the TFEL panel; the perfluorinated materials have low chemical reactivity and leave essentially no residue. They have low surface tension and have a high dielectric strength, which assists in avoiding arcing.

In preferred embodiments, the perfluorinated inert liquids are selected from those completely fluorinated organic compounds (i.e., having all carbon-hydrogen bonds replaced by carbon-fluorine bonds) sold under the trademark Fluorinert ® by the Commercial Chemicals Division of the 3M Company, St. Paul, MN 55144-1000 See, Product Information Bulletin, Fluorinert ® Electronic Liquids, 3M Company, 1985, the disclosure of which, to the extent necessary, is hereby incorporated herein by reference.

Especially preferred members of the completely fluorinated group of perfluorinated inert liquids are the liquids, Fluorinert ® FC-40, FC-70, and FC-5312. These materials have boiling points of 155°, 215°, and 215° C. respectively, all equal to or above the operating temperatures of most TFEL panels.

The prior art problems solved by this invention include:

1. Panel filling time is shortened to less than 30 seconds.
2. The perfluorinated inert liquids do not interfere with the preferred fill hole closure method, and the preferred solder closure method does not contaminate the perfluorinated inert liquids. The panel fill holes can be closed with no subsequent cleaning step required.
3. Preferred perfluorinated inert liquids of the present invention absorb only about 10 ppm water and thus do not require as much water bake-out and/or pump-out as do the silicone oils used previously.

DETAILED DESCRIPTION OF THE PREFERRED EMBODIMENTS

Figure 1:
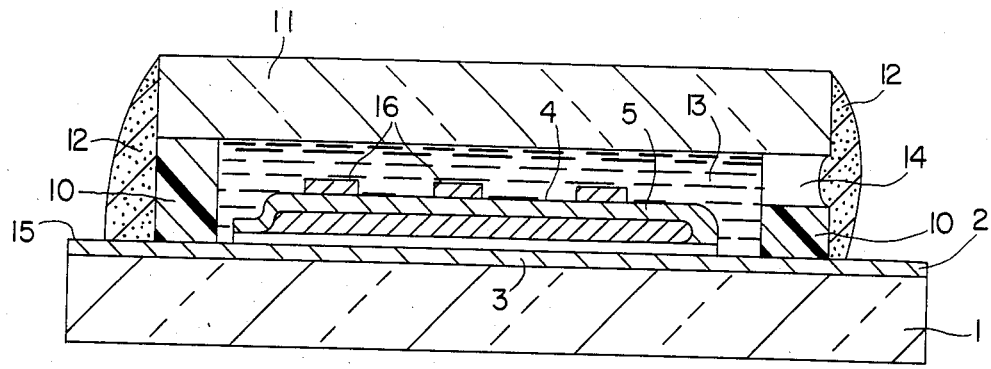
FIG. 1 is a cross-sectional view of a conventional TFEL panel.

The present invention is directed to the use of perfluorinated inert liquids as the protective fill fluid in thin film electroluminescent (TFEL) flat panel displays. The present invention is also directed to TFEL panels containing such materials and to methods of filling TFEL panels with the protective fill fluids of the present invention. The use of these fluids enhance panel aging and life test characteristics.

The perfluoroaliphatic ethers and perfluoroalkyl tertiary amines, together with the perfluoroalkanes, comprise the class of materials known as perfluorinated inert fluids. They are colorless, odorless, dense, virtually nontoxic, and nonflammable compounds with an extremely nonpolar character. Prior to the present invention, these materials have been used primarily as dielectric heat-transfer and test-bath fluids in the electronics industry and as hydraulic fluids and lubricants for specialty applications.

The perfluoroaliphatic ethers ave thermal stabilities equivalent to the perfluoroalkanes when heated in stainless steel tubes. They undergo no quantitatively significant decomposition until they are heated above about 400° C. The perfluoroalkyl tertiary amines are slightly less stable thermally and begin to decompose at above about 250° C.

The low polarizability of these inert liquids give them excellent dielectric properties. Their dielectric strengths are about 40 kV (ASTM D 877); their dissipation factors are about 0.001 at 1 MHz; their dielectric constants are about 1.8; and their volume resistivities are about $1 \times 10^{15}$ ohm-cm (ASTM D 257).

The inert character of the perfluoro- ethers and tertiary amines is demonstrated by their lack of basicity or reactivity normally associated with hydrocarbon ethers or amines. They are not attacked by most oxidizing or reducing agents or strong acids or bases. Like the perfluoroalkanes, the perfluoroethers and tertiary amines may react violently with fused alkali metals.

The solvent properties of the perfluorinated inert liquids are also unusual because of their nonpolar nature and low intermolecular forces. Water and alcohols are almost completely insoluble. Most hydrocarbons and nonfluorine containing aliphatic halogen compounds are only slightly soluble.

The perfluorinated inert liquids are typically prepared by fluorination of the counterpart hydrocarbon species. In an electrochemical fluorination process, organic reactants are dissolved in anhydrous hydrogen fluoride to form conductive solutions. The solutions are electrolyzed with direct current at from about 4 to 8 V in a single-compartment cell, usually with nickel electrodes. Essentially complete replacement of the organic hydrogen atoms by fluorine atoms occurs at the anode and hydrogen gas is released at the cathode.

For example:

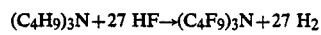

$$(C_4H_9)_3N + 27\ HF \rightarrow (C_4F_9)_3N + 27\ H_2$$

A low temperature condenser strips HF and liquid products from the hydrogen steam. Liquid products, higher in density and insoluble in HF, are recovered by phase separation or distillation.

The products of electochemical fluorination generally contain appreciable amounts of the perfluorinated analogues of the starting materials. In addition, because of extensive molecular rearrangement, many isomers and perfluorinated cleavage products are also present. The products are usually purified by treatment with base and distillation.

While the perfluorinated inert liquids may be readily prepared synthetically, they are also commercially available. The perfluoro ethers and tertiary amines are main constituents of some members of the family of the Fluorine ® Electronic Liquids marketed by the 3M Company.

The most preferred perfluorinated inert liquids of the present invention are the Fluorinert ® Electronic Liquids having boiling points equal to or above the operating temperature of the TFEL panel in which they are to serve as the protective fluid.

These materials are members of a family of completely fluorinated organic compounds that have a unique combination of properties. They are derived from common organic compounds by replacement of all carbon-bound hydrogen atoms with fluorine atoms by electrochemical fluorination.

Since fluorination is complete, the products contain no hydrogen or chlorine This makes the properties of the Fluorinert ® Liquids vastly different from hydrocarbons or the chlorofluorocarbons commonly used as degreasing solvents, refrigerants and aerosol propellants.

The dielectric strength of these liquids is very high, being in excess of 35,000 volts per 0.1 inch gap. In the vapor phase, the dielectric strength is very nearly that of the liquid. Their dielectric constants are low, as are the dissipation factors, even in the X-ban region.

In general, the Fluorinert ® Liquids can be classified as poor solvents. Water solubility is in the order of a few parts per million. Oil solubility is also quite low. They do have some affinity for other highly chlorinated or fluorinated fluids and all the Fluorinert ® Liquids are completely miscible with one another.

The Fluorinert ® Liquids are a series of very efficient dielectric coolants, developed specifically to meet the strenuous demands of the widely diversified electronics industry. Exceedingly stable, these perfluorocarbons have been designed to be compatible with sensitive electronic components and materials of construction such as metals, plastics and elastomers.

The non-flammable, non-explosive nature of the Fluorine ® Liquids indicates that they can be used in almost any location that is supplied with ventilation which is adequate to prevent vapor buildup. In keeping with good hygienic standards, breathing of vapor from these liquids should be avoided, and hands should be washed prior to smoking or eating.

Figure 2:
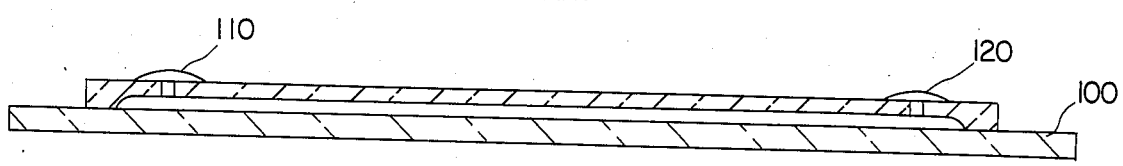
FIG. 2 is a cross-sectional view of a TFEL panel cover plate prepared according to the present invention.

As illustrated in FIG. 2, the cover plate 100 of the TFEL panel of the present invention employs at least two fill holes 110 and 120.

In one preferred filling method, the filling apparatus is placed in a dry box filled with dry air or other suitable dry gas such as nitrogen or argon. The perfluorinated inert fill fluid is outgassed by heating at from about 90° to 120° C. and evacuating the gas over the fluid to approximately 10 Torr. The panel is then filled by attaching a fill tube to one hole in the panel cover using an "0" ring seal and allowing the perfluorinated inert liquid to fill the panel by gravity flow, i.e., by positioning the fill reservoir higher than the panel and opening a valve to allow the liquid to flow into the panel.

Alternatively, the panel also may be filled by vacuum filling, i.e., by attaching 2 hoses to the panel. One hose is connected to a reservoir containing the outgassed perfluorinated inert fill fluid, and the second hose is connected to a vacuum reservoir. The panel is filled by applying a vacuum of from about 300–400 Torr and allowing the reservoir pressure, which is approximately atmospheric pressure (760 Torr), to move the perfluorinated inert fill liquid into the panel.

Figure 3:
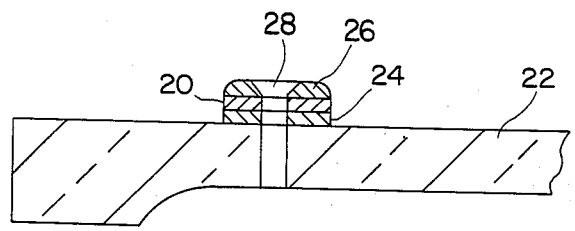
FIG. 3 illustrates in detail the preferred seal hole design (open position) used in connection with the fill fluid of the present invention.
Figure 4:
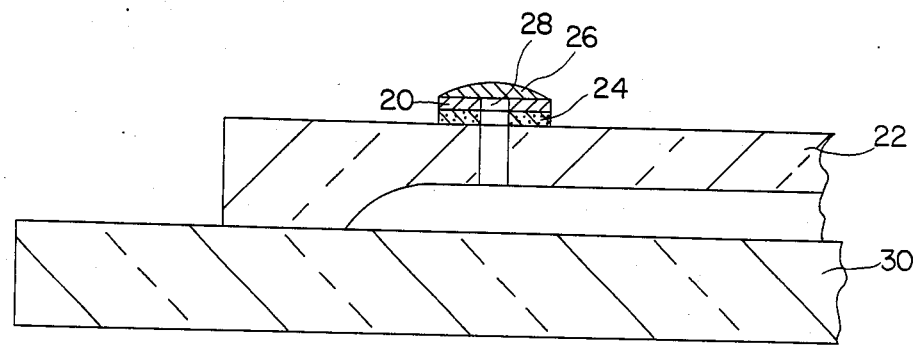
FIG. 4 illustrates in detail the preferred seal hole design (closed position) used in connection with the fill fluid of the present invention.

After either filling method, the two fill holes are then sealed off, preferably by reflowing solder over metal washers which have previously been adhesively bonded over the two holes in the cover plate and pretinned with solder. FIGS. 3 and 4 illustrate this preferred fill hole seal design, in the open and closed mode, respectively.

The fill hole seal design of FIGS. 3 and 4 consists of a Kovar washer 20 which is bonded to the glass cover plate 22 (e.g.. Corning 7059) using a heat curing epoxy adhesive 24. Preferably, the Kovar washer is pretinned with 50/50 tin lead solder 26 by first cleaning the Kovar washer, e.g., with a fiberglass eraser, applying liquid rosin flux and then applying solder using a solder iron.

The pretin solder is placed as shown in FIG. 3 with the hole 28 left open. If the hole closes over with solder, the hole can be opened by reheating the solder with the solder iron until it remelts and then poking a hole through it, e.g., by using a straight dental pick.

Kovar was selected as a washer material because it is solderable and matches the thermal expansion of the cover glass. Any other glass or any other solderable metal can be used as long as the difference in thermal expansion between the metal washer and the glass is not high enough to cause cracking of the glass. Likewise, any adhesive can be used that gives a strong enough bond to the glass, has a low moisture vapor transmission rate, and gives a leak tight seal.

Similarly, many different solder compositions can be used as long as they adhere to the metal washer and are not too high in soldering temperature to cause deterioration of the metal to glass adhesive seal, or cause glass cracking. Solder glasses can also be used to bond the metal washer to the glass cover.

The pretinned Kovar washer cover is cleaned using isopropyl alcohol to remove any flux remaining. In the dry box the covers are bonded to a TFEL substrate using an epoxy adhesive. The sealed panel is filled with the protective fluid. The two holes are then immediately closed merely by reflowing the solder using a solder iron and causing the solder to close the hole, similar to that shown in FIG. 4. Additional solder can be added if necessary to close the hole.

The illustrated hole sealing design is ideal for use with the protective liquids of the present invention as it is quick and does not require the use of any liquid adhesives. Liquid adhesives can be very messy and they can require substantial time to cure. Further, the use of the illustrated hole closing method is noncontaminating to the perfluorinated inert liquids which are used to fill the panel. Conversely, liquid adhesives can tend to mix with the protective fluids and contaminate them.

The present invention has been described in detail, including the preferred embodiments thereof. However, it will be appreciated that those skilled in the art, upon consideration of the present disclosure, may make modifications and/or improvements on this invention and still be within the scope and spirit of this invention as set forth in the following claims.

What is claimed is:

1. A method of fabricating a thin-film electroluminescent display panel on a transparent substrate comprising;

disposing a cover plate relative to the transparent substrate in such a manner as to define a cavity therebetween, said cavity containing a thin-film electroluminescent composite member;

providing said cover plate with at least two fill holes; and introducing a perfluorinated inert liquid protective fluid into said cavity through one of said fill holes, the protective fluid being selected to have a boiling point above the operating temperature of the thin-film electroluminescent display panel.

2. The method according to claim 1, wherein the protective fill fluid comprises a completely fluorinated organic compound.

3. The method according to claim 2, further including the step of utilizing gravity flow for the introduction of the protective liquid onto the cavity through one of the fill holes.

4. The method according to claim 2, further including the step of utilizing vacuum flow for the introduction of the protective liquid onto the cavity through one of the fill holes.

5. A thin-film electroluminescent display panel comprising:
- a nonconductive cover plate and a transparent nonconductive substrate disposed so as to define a cavity therebetween;
- a composite member comprising a thin film electroluminescent layer sandwiched between a pair of dielectric layers, said composite member being transparent to light emitted by said electroluminescent layer when activated;
- a pair of opposing electrodes positioned to define and activate said composite member therebetween;
- a perfluorinated inert liquid protective fluid disposed within said cavity defined by said cover plate and said substrate and being in contact with said dielectric layers, said fluid having a boiling point equal to or above the operating temperature of the TFEL panel;
- the cover plate being provided with at least two fill holes.

6. The display panel according to claim 5, wherein said protective liquid is a completely fluorinated organic compound.

7. The display panel according to claim 5, wherein the substrate comprises transparent glass.

8. The display panel according to claim 7, wherein spacer means are provided between the cover plate and the glass substrate for determining the position of each relative to the other.

9. The display panel according to claim 8, wherein an adhesive is further provided for combining the substrate and the cover plate to one another.

10. The display panel according to claim 9, wherein the dielectric layers completely enclose the thin-film electroluminescent layer.

11. The display panel of claim 10, wherein electrodes are provided on each of the dielectric layers.

12. The display panel of claim 10, further including a background means for providing a background for said thin-film electroluminescent layer.

* * * * *